United States Patent
Carrell et al.

(10) Patent No.: US 12,374,521 B2
(45) Date of Patent: Jul. 29, 2025

(54) VOLUME FILLING CASSETTE FOR LOAD LOCK

(71) Applicant: Applied Materials, Inc., Santa Clara, CA (US)

(72) Inventors: Michael Mason Carrell, Leander, TX (US); Jason M. Schaller, Austin, TX (US); Victor Flores Iracheta, Prosper, TX (US)

(73) Assignee: Applied Materials, Inc., Santa Clara, CA (US)

( * ) Notice: Subject to any disclaimer, the term of this patent is extended or adjusted under 35 U.S.C. 154(b) by 414 days.

(21) Appl. No.: 17/981,188

(22) Filed: Nov. 4, 2022

(65) Prior Publication Data

US 2024/0153733 A1    May 9, 2024

(51) Int. Cl.
| | |
|---|---|
| *H01J 37/20* | (2006.01) |
| *C23C 14/48* | (2006.01) |
| *C23C 14/56* | (2006.01) |
| *H01J 37/317* | (2006.01) |
| *H01L 21/67* | (2006.01) |

(52) U.S. Cl.
CPC .............. *H01J 37/20* (2013.01); *C23C 14/48* (2013.01); *C23C 14/566* (2013.01); *H01J 37/3171* (2013.01); *H01L 21/67201* (2013.01); *H01J 2237/201* (2013.01); *H01J 2237/204* (2013.01)

(58) Field of Classification Search
None
See application file for complete search history.

(56) References Cited

U.S. PATENT DOCUMENTS

2013/0320208 A1* 12/2013 Lee .................... H01J 37/3171
236/44 C

FOREIGN PATENT DOCUMENTS

| JP | 2003031635 A | * | 1/2003 |
| JP | 2003086668 A | * | 3/2003 |
| KR | 20110064589 A | * | 6/2011 |

* cited by examiner

*Primary Examiner* — Andrew Smyth
(74) *Attorney, Agent, or Firm* — KDW Firm, PLLC

(57) ABSTRACT

An ion implantation system including an ion source for generating an ion beam, an end station containing a platen for supporting a substrate to be implanted by the ion beam, and a load lock disposed adjacent the end station and adapted to transfer substrates between an external environment and the end station. The load lock may include a transfer chamber having a hollow interior, a first isolation door affixed to a first side of the transfer chamber and openable to the external environment, a second isolation door affixed to a second side of the transfer chamber and openable to an interior of the end station, and a volume filling cassette disposed within the hollow interior of the transfer chamber and adapted to hold at least one substrate.

18 Claims, 2 Drawing Sheets

VOLUME FILLING CASSETTE FOR LOAD LOCK

FIELD OF THE DISCLOSURE

The disclosure relates generally to processing apparatus for semiconductor devices, and more particularly to a removable, volume filling cassette for reducing the interior volume of a load lock.

BACKGROUND OF THE DISCLOSURE

Ion implantation is a standard technique for introducing conductivity-altering impurities into a workpiece such as a wafer or other substrate. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

In ion implantation systems such as the one described above, workpieces are transferred into and out of a so-called "end station" where implantation is performed. An interior of the end station is maintained at or near vacuum to prevent workpiece contamination. To transfer a workpiece between an atmospheric, external environment and the interior of the end station, the workpiece is placed in a device called a "load lock." The load lock includes a transfer chamber having a first door that opens to the external environment and a second door that opens to the interior of the end station. After the workpiece is placed in the transfer chamber, the first door is closed, and the transfer chamber is pumped down to vacuum or near vacuum. The second door can then be opened, and the workpiece can be moved into the end station. To move the workpiece out of the end station, the workpiece is placed in the transfer chamber and the second door is closed. The transfer chamber is then vented to ambient pressure. The first door can then be opened, and the workpiece can be moved into the external environment.

The transfer chambers of load locks often have large interior volumes requiring significant amounts of time to pump down and vent during the transfer of workpieces. In some cases, these large interior volumes are significantly larger than necessary for accommodating the workpieces being transferred. This is because load locks are typically large and are machined from a single block of metal and are therefore not amenable to machining processes capable of producing small and intricate interior dimensions and features for providing load locks with smaller interior volumes. Lengthy pump down and venting times can create bottlenecks in ion implantation systems and can detrimentally affect throughput.

With respect to these and other considerations the present disclosure is provided.

BRIEF SUMMARY

This Summary is provided to introduce a selection of concepts in a simplified form. This Summary is not intended to identify key features or essential features of the claimed subject matter, nor is this Summary intended as an aid in determining the scope of the claimed subject matter.

An ion implantation system in accordance with an exemplary embodiment of the present disclosure may include an ion source for generating an ion beam, an end station containing a platen for supporting a substrate to be implanted by the ion beam, and a load lock disposed adjacent the end station and adapted to transfer substrates between an external environment and the end station. The load lock may include a transfer chamber having a hollow interior, a first isolation door affixed to a first side of the transfer chamber and openable to the external environment, a second isolation door affixed to a second side of the transfer chamber and openable to an interior of the end station, and a volume filling cassette disposed within the hollow interior of the transfer chamber and adapted to hold at least one substrate.

A load lock in accordance with an exemplary embodiment of the present disclosure may include a transfer chamber having a hollow interior, a first isolation door affixed to a first side of the transfer chamber, a second isolation door affixed to a second side of the transfer chamber, and a volume filling cassette disposed within the hollow interior of the transfer chamber and adapted to hold at least one substrate.

A volume filling cassette in accordance with an exemplary embodiment of the present disclosure may include a floor, a ceiling, first and second sidewalls, and a plurality of tines extending inwardly from the first and second sidewalls, the plurality of tines defining shelves for supporting a plurality of substrates in a vertically stacked arrangement.

BRIEF DESCRIPTION OF THE DRAWINGS

The accompanying drawings illustrate exemplary approaches of the present disclosure, including the practical application of the principles thereof, as follows.

Figure 1:
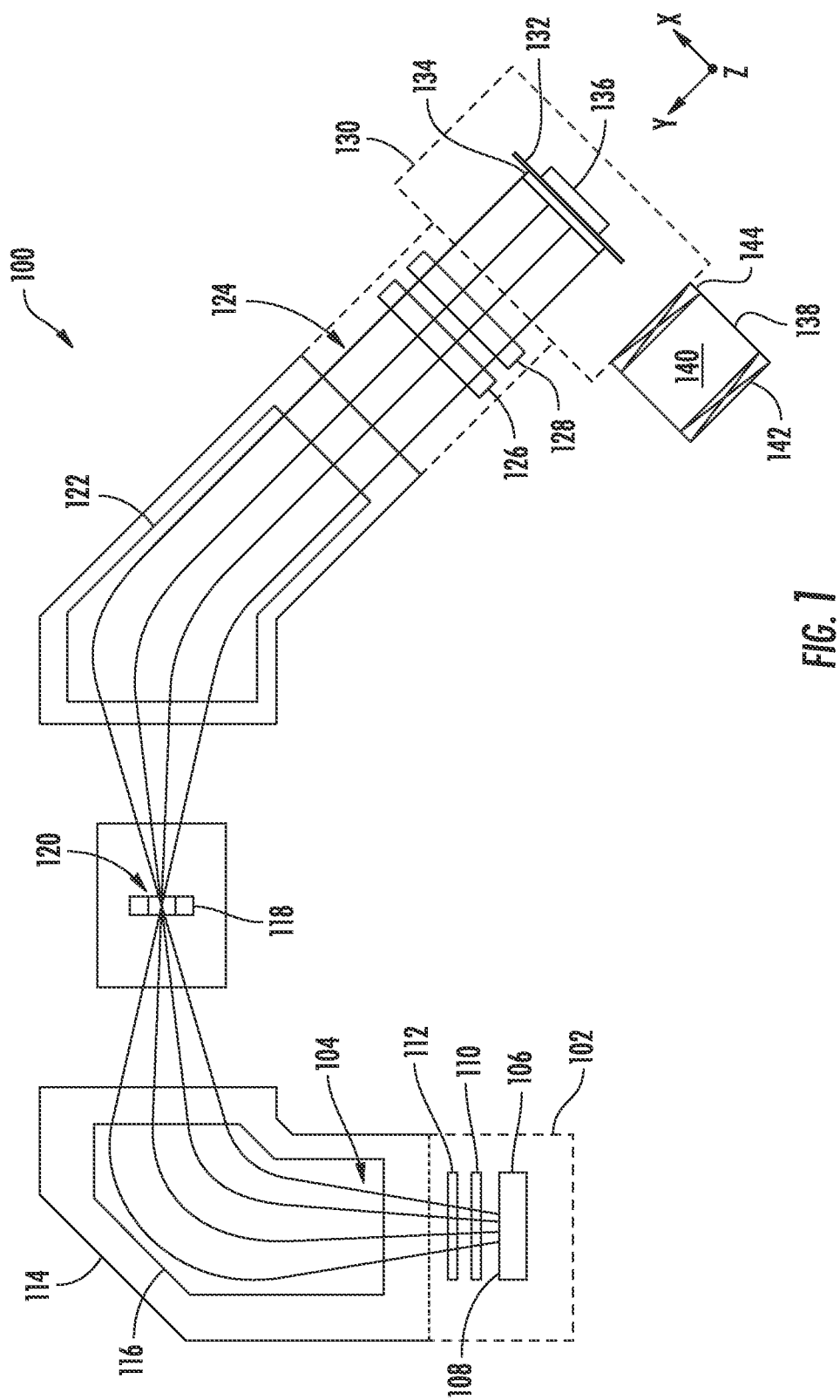
FIG. 1 is a schematic view illustrating an exemplary embodiment of an ion implantation system in accordance with the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

DETAILED DESCRIPTION

An ion implantation system, a load lock, and a volume filling cassette in accordance with the present disclosure will now be described more fully hereinafter with reference to the accompanying drawings, wherein embodiments of the system, the load lock, and the cassette are shown. The system, the load lock, and the cassette may be embodied in many different forms and are not to be construed as being limited to the embodiments set forth herein. Instead, these embodiments are provided so this disclosure will convey certain exemplary aspects of the system, the load lock, and the cassette to those skilled in the art.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

The system and apparatus disclosed herein are described in connection with an ion implantation system used in the processing of workpieces such as, for example, semiconductor wafers, flat panels, solar cells, light-emitting diodes (LEDs), etc. The present disclosure is not limited in this regard. FIG. 1 is a schematic diagram illustrating an exemplary ion implantation system 100. The ion implantation system 100 is one of many examples of beam-line ion implanters capable of producing and directing ions for processing workpieces. Thus, the systems and apparatus disclosed herein are not limited to implementation with the ion implantation system 100 of FIG. 1. Various types of ion implanters can be substituted for the ion implantation system 100 as may be suitable for a particular application.

In general, the ion implantation system 100 (hereinafter "the implanter 100") may include an ion source 102 adapted to generate ions for forming an ion beam 104. The ion source 102 may include an ion chamber 106 where the ions are produced. The ion species may be, or may include or contain, hydrogen, helium, oxygen, nitrogen, arsenic, boron, phosphorus, aluminum, indium, gallium, antimony, carborane, other rare gases, alkanes, another large molecular compound, or other p-type or n-type dopants. The present disclosure is not limited in this regard. The generated ions may be extracted from the ion chamber 106 by a series of extraction electrodes to form the ion beam 104. In particular, the ions may be extracted from chamber 106 by an extraction electrode 108 (e.g., integral with an exit aperture of the ion chamber 106), a suppression electrode 110, and a ground electrode 112.

The ion beam 104 is mass analyzed by mass analyzer 114 having a resolving magnet 116 and a masking electrode 118 having a resolving aperture 120. The resolving magnet 116 deflects ions in the ion beam 104 to isolate ions having a desired mass-to-charge ratio associated with a particular dopant ion species subsequently allowed to pass through the resolving aperture 120. Undesired ion species are deflected into, and blocked by, the masking electrode 118 and thus do not pass through the resolving aperture 120.

Ions of the desired ion species pass through resolving aperture 120 to an angle corrector magnet 122. The angle corrector magnet 122 deflects ions of the desired ion species and converts the ion beam from a diverging ion beam to a focused ion beam 124 (e.g., a ribbon beam or a spot beam) having generally parallel ion trajectories. The implanter 100 may further include acceleration unit 126 and/or a deceleration unit 128. The acceleration and deceleration units 126, 128 may be used to speed up or slow down the focused ion beam 124. Speed adjustment is accomplished by applying specific combinations of voltage potentials to sets of electrodes disposed on opposite sides of the focused ion beam 124. As the focused ion beam 124 passes between the electrodes, ion energies are increased or decreased depending on the applied voltage potentials. Since the depth of an ion implant is proportional to the energy of the impinging ion beam, beam acceleration may be desirable when performing deep ion implants. Conversely, where shallow ion implants are desired, beam deceleration is performed to ensure the impinging ions travel only a short distance into the workpiece.

An end station 130 of the implanter 100 may include a platen 132 configured to support one or more workpieces, such as substrate 134. The substrate 134 may be disposed in the path of the focused ion beam 124 and ions of the desired ion species may be implanted into the substrate 134. The substrate 134 may be, for example, a semiconductor wafer, solar cell, etc. The end station 130 may include a scanner 136 adapted to move the platen 132 and the substrate 134 perpendicular to the long dimension of the focused ion beam 124 (i.e., along the X-axis of the illustrated Cartesian coordinate system) for distributing ions over the entire surface of the substrate 134. The scanner 136 may further be adapted to move the platen 132 and the substrate 134 parallel to the long dimension of the focused ion beam 124 (i.e., along the Y-axis of the illustrated Cartesian coordinate system). The scanner 136 may further be adapted to tilt or rotate the platen 132 and the substrate 134 relative to the focused ion beam 124 (e.g., rotate the platen 132 and the substrate 134 about the Y-axis of the illustrated Cartesian coordinate system). The present disclosure is not limited in this regard. The implanter 100 may include additional components known to those skilled in the art and may incorporate hot or cold implantation of ions in some embodiments.

The implanter 100 may further include a load lock 138 adjoining the end station 130 for facilitating the transfer of substrates into and out of the end station 130 while maintaining a vacuum (or near vacuum) within the end station 130. The load lock 138 may include a transfer chamber 140, a first isolation door 142, and a second isolation door 144. The first isolation door 142 may be affixed to a first side of the transfer chamber 140 and, when in a closed position, may be adapted to provide an airtight seal between the transfer chamber 140 and the external environment. The second isolation door 144 may be affixed to a second side of the transfer chamber 140 and, when in a closed position, may be adapted to provide an airtight seal between the transfer chamber 140 and the interior of the end station 130.

In order to transfer a substrate into the end station 130, the first isolation door 142 may opened and the substrate may be placed into the transfer chamber 140 (e.g., by a robot, not shown). The first isolation door 142 may then be closed, and the interior of the transfer chamber 140 may be evacuated or "pumped down" to a vacuum level that is compatible with a vacuum environment within the end station 130 (100 millitorr, for example). After evacuation of the transfer chamber 140 is complete, the second isolation door 144 may be opened, and the substrate may be moved from the transfer chamber 140 into the end station 130 (e.g., by a robot, not shown).

In order to transfer a substrate from the end station 130 back into the external environment, the second isolation door 144 may be opened, and the substrate may be placed into the transfer chamber 140. The second isolation door 144 may then be closed, and the interior of the transfer chamber 140 may vented to atmospheric pressure. After venting of the transfer chamber 140 is complete, the first isolation door 142 may be opened, and the substrate may be moved from the transfer chamber 140 into the external environment.

Figure 2:
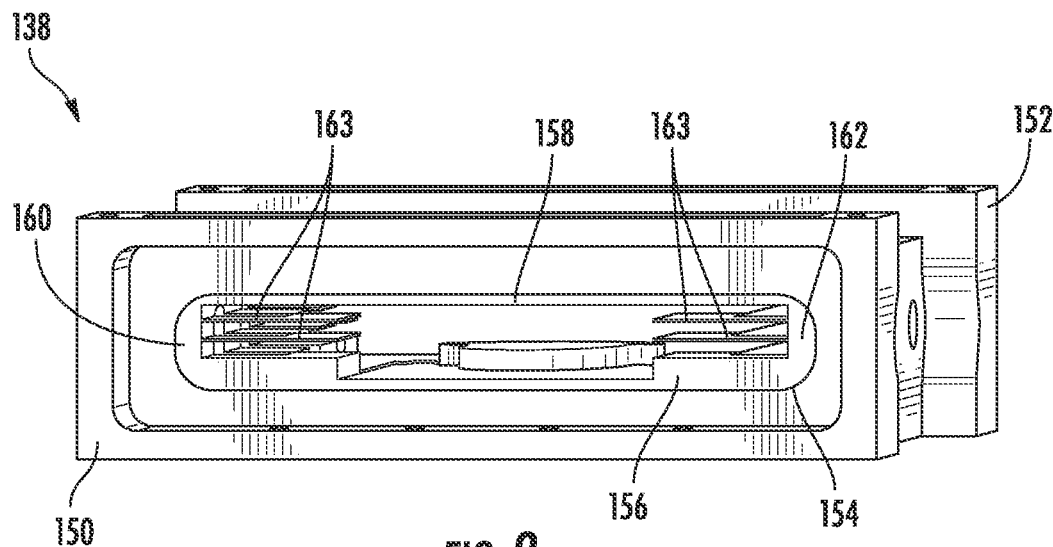
FIG. 2 is a perspective front view illustrating a load lock of the ion implantation system shown in FIG. 1.
Figure 3:
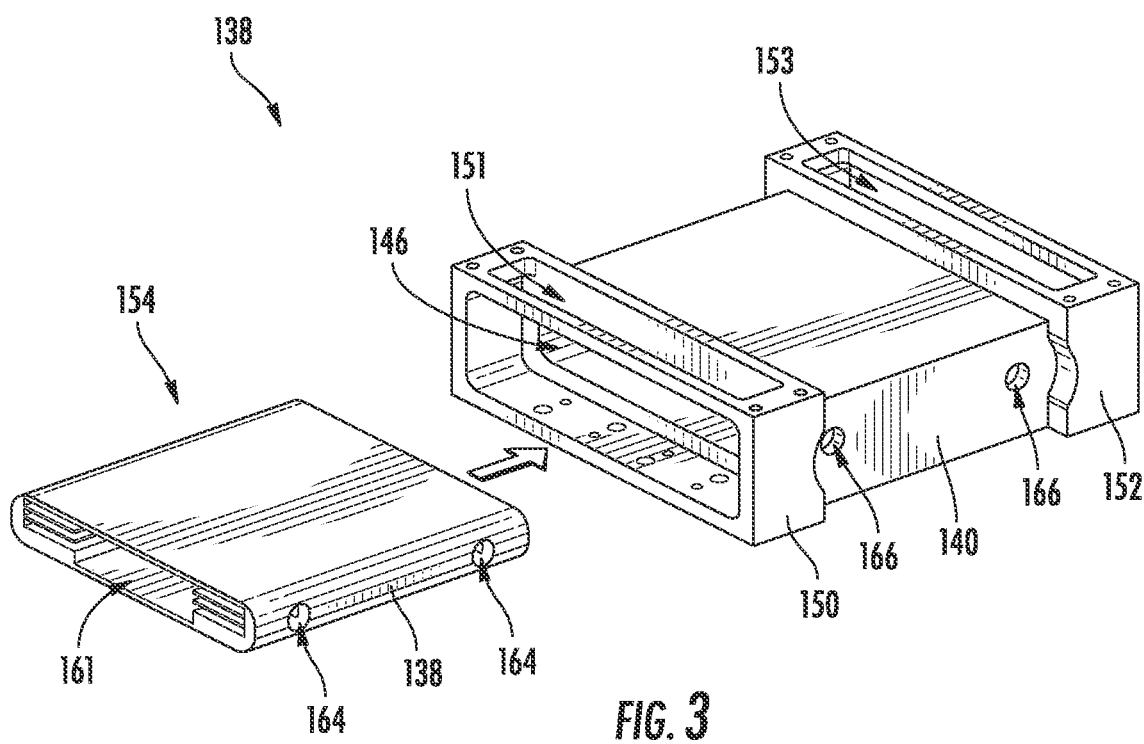
FIG. 3 is an exploded view illustrating the load lock shown in FIG. 2.

Referring to FIGS. 2A and 2B, a perspective view and an exploded view illustrating the load lock 138 are shown, respectively, with the first and second isolation doors 142, 144 omitted for clarity. For the sake of convenience and clarity, terms such as "top," "bottom," "up," "down," "upper," "lower," "above," "below," "front," "rear," "ceiling," and "floor" may be used herein to describe the relative positions and orientations of various components of the load lock 138, all with respect to the geometry and orientation of the load lock 138 as it appears in FIGS. 2A and 2B. Said terminology will include the words specifically mentioned, derivatives thereof, and words of similar import The transfer chamber 140 of the load lock 138 may have a hollow interior 146 having a free (i.e., empty) volume v1. In various embodiments, the free volume v1 may be in a range of 3 liters to 70 liters. The present disclosure is not limited in this regard. First and second flanges 150, 152 may extend from the front and rear sides of the transfer chamber 140 for accommodating the first and second isolation doors 142, 144 (see FIG. 1). In various embodiments, the first and second isolation doors 142, 144 may be mounted to the tops of the first and second flanges 150, 152, respectively, and may be extended and retracted through respective first and second openings 151, 153 in the first and second flanges 150, 152. The present disclosure is not limited in this regard.

The load lock 138 may further include a volume filling cassette 154 (hereinafter "the cassette 154") disposed within the hollow interior 146 of the transfer chamber 140. The cassette 154 may be formed of a metal such as stainless steel or aluminum, for example. The cassette 154 may have a floor 156, a ceiling 158, first and second sidewalls 160, 162, and a plurality of tines 163 extending inwardly from the first and second sidewalls 160, 162. The tines 163 may define shelves for supporting a plurality of substrates in a vertically stacked arrangement. The cassette 154 is depicted as having two tines 163 extending from the first sidewall 160 and two tines extending from the second sidewall 162. The present disclosure is not limited in these regard, and alternative embodiments of the load lock 138 may have a greater or fewer number of tines extending from the first and second sidewalls 160, 162.

The exterior dimensions of the cassette 154 may be nearly identical to the interior dimensions of the hollow interior 146 of the transfer chamber 140, with the cassette 154 fitting within the transfer chamber 140 in a close clearance relationship therewith. In various embodiments, the cassette 154 may have a length in a range of 175 millimeters to 600 to millimeters, a width in a range of 230 millimeters to 600 millimeters, and a height in a range of 30 millimeters to 700 millimeters. The present disclosure is not limited in this regard. The cassette 154 may be removably fastened to the transfer chamber 140 by mechanical fasteners (not shown) extending through the floor 156, ceiling 158, and/or first and second sidewalls 160, 162 of the transfer chamber 140.

The cassette 154 may have a hollow interior 161 having a free (i.e., empty) volume v2. In various embodiments, the free volume v2 may be in a range of 2 liters to 60 liters. A plurality of ports 164 may be formed in the second sidewall 162 of the cassette 154. When the cassette 154 is installed within the transfer chamber 140, the ports 164 may be aligned with corresponding ports 166 formed in an adjacent sidewall of the transfer chamber 140. The ports 166 may accommodate connections to hoses, lines, tubes, etc. for connecting the hollow interior 161 of the cassette 154 to one or more pumping and/or venting devices (via the ports 164) for pumping the hollow interior 161 down to vacuum (or near vacuum) and venting the hollow interior 161 to atmospheric pressure as described above.

Since the hollow interior 161 of the cassette 154 has a free volume v2 less than the free volume v1 of the hollow interior 146 of the transfer chamber 140, and since the cassette 154 consumes all (or nearly all) of the free volume v1 within the transfer chamber 140 except for the free volume v2, the cassette 154 effectively reduces the free volume within the transfer chamber 140 from v1 to v2. In various examples, the free volume v2 may be 30-50% smaller than the free volume v1. Thus, when the transfer chamber 140 is pumped down or vented in the manner described above (e.g., during transfer of substrates into and out of the end station 130), the amount of free volume within the transfer chamber 140 requiring pumping down or venting is reduced by 30-50%, in-turn reducing the amount of time required to pump down or vent the transfer chamber 140 by 30-50%. This may significantly improve the throughput of the implanter 100 in situations wherein transferring substrates through the load lock 138 would otherwise present a bottleneck due to lengthy pump down and venting times.

In view of the above, the embodiments of the present disclosure provide at least the following advantages. As a first advantage, the cassette 154 effectively reduces the free volume within the transfer chamber 140 to significantly reduce pump down and venting times. As a second advantage, the cassette 154 is significantly smaller than the load lock 138 and is therefore more amenable to machining processes capable of producing small and intricate interior dimensions and features for achieving the reduced volume described above.

While certain embodiments of the disclosure have been described herein, the disclosure is not limited thereto, as the disclosure is as broad in scope as the art will allow and the specification may be read likewise. Therefore, the above description is not to be construed as limiting. Those skilled in the art will envision other modifications within the scope and spirit of the claims appended hereto.

The invention claimed is:

1. An ion implantation system comprising:
   an ion source for generating an ion beam;
   an end station containing a platen for supporting a substrate to be implanted by the ion beam; and
   a load lock disposed adjacent the end station and adapted to transfer substrates between an external environment and the end station, the load lock comprising:
   a transfer chamber having a hollow interior;
   a first isolation door affixed to a first side of the transfer chamber and openable to the external environment;
   a second isolation door affixed to a second side of the transfer chamber and openable to an interior of the end station; and
   a volume filling cassette disposed within the hollow interior of the transfer chamber and adapted to hold at least one substrate, wherein the volume filling cassette has a plurality of ports formed therein, the plurality of ports aligned with a corresponding plurality of ports in the transfer chamber for connecting a hollow interior of the volume filling cassette to at least one of a pumping device and a venting device.

2. The ion implantation system of claim 1, wherein the hollow interior of the transfer chamber has a free volume v1 and the volume filling cassette has a hollow interior with a free volume v2, wherein v2 is 30-50% less than v1.

3. The ion implantation system of claim 1, wherein the volume filling cassette includes a floor, a ceiling, first and second sidewalls, and a plurality of tines extending inwardly from the first and second sidewalls, the plurality of tines defining shelves for supporting a plurality of substrates in a vertically stacked arrangement.

4. The ion implantation system of claim 1, wherein the volume filling cassette is formed of one of stainless steel and aluminum.

5. The ion implantation system of claim 1, wherein the volume filling cassette is removably disposed within the transfer chamber.

6. The ion implantation system of claim 5, wherein the volume filling cassette is affixed to the transfer chamber by a plurality of mechanical fasteners.

7. The ion implantation system of claim 1, wherein the volume filling cassette has a length in a range of 175 millimeters to 600 to millimeters, a width in a range of 230 millimeters to 600 millimeters, and a height in a range of 30 millimeters to 700 millimeters.

8. A load lock for an ion implantation system, the load lock comprising:
   a transfer chamber having a hollow interior;
   a first isolation door affixed to a first side of the transfer chamber;
   a second isolation door affixed to a second side of the transfer chamber; and
   a volume filling cassette disposed within the hollow interior of the transfer chamber and adapted to hold at least one substrate, wherein the volume filling cassette has a plurality of ports formed therein the plurality of ports aligned with a corresponding plurality of ports in the transfer chamber for connecting a hollow interior of the volume filling cassette to at least one of a pumping device and a venting device.

9. The load lock of claim 8, wherein the hollow interior of the transfer chamber has a free volume v1 and the volume filling cassette has a hollow interior with a free volume v2, wherein v2 is 30-50% less than v1.

10. The load lock of claim 8, wherein the volume filling cassette includes a floor, a ceiling, first and second sidewalls, and a plurality of tines extending inwardly from the first and second sidewalls, the plurality of tines defining shelves for supporting a plurality of substrates in a vertically stacked arrangement.

11. The load lock of claim 8, wherein the volume filling cassette is formed of one of stainless steel and aluminum.

12. The load lock of claim 8, wherein the volume filling cassette is removably disposed within the transfer chamber.

13. The load lock of claim 12, wherein the volume filling cassette is affixed to the transfer chamber by a plurality of mechanical fasteners.

14. The load lock of claim 8, wherein the volume filling cassette has a length in a range of 175 to 600 millimeters to millimeters, a width in a range of 230 to 600 millimeters to millimeters, and a height in a range of 30 to 700 millimeters to millimeters.

15. A volume filling cassette for a load lock of an ion implantation system, the volume filling cassette comprising:
   a floor;
   a ceiling;
   first and second sidewalls; and
   a plurality of tines extending inwardly from the first and second sidewalls, the plurality of tines defining shelves for supporting a plurality of substrates in a vertically stacked arrangement;
   wherein the volume filling cassette has a plurality of ports formed therein, the plurality of ports adapted to be aligned with a corresponding plurality of ports in a transfer chamber for connecting a hollow interior of the volume filling cassette to at least one of a pumping device and a venting device.

16. The volume filling cassette of claim 15, wherein a hollow interior of the volume filling cassette has a free volume in a range of 2 liters to 60 liters.

17. The volume filling cassette of claim 15, wherein the volume filling cassette is formed of one of stainless steel and aluminum.

18. The volume filling cassette of claim 15, wherein the volume filling cassette has a length in a range of 175 millimeters to 600 to millimeters, a width in a range of 230 millimeters to 600 millimeters, and a height in a range of 30 millimeters to 700 millimeters.

* * * * *